United States Patent
Aboudina et al.

(10) Patent No.: US 10,594,325 B2
(45) Date of Patent: Mar. 17, 2020

(54) FAST WAKEUP FOR CRYSTAL OSCILLATOR

(71) Applicant: GOODIX TECHNOLOGY INC., San Diego, CA (US)

(72) Inventors: Mohamed Aboudina, San Diego, CA (US); Ahmed Emira, San Diego, CA (US); Faisal Hussien, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 41 days.

(21) Appl. No.: 16/028,434

(22) Filed: Jul. 6, 2018

(65) Prior Publication Data

US 2020/0014390 A1  Jan. 9, 2020

(51) Int. Cl.
| | | |
|---|---|---|
| H03L 7/08 | (2006.01) | |
| H03B 5/32 | (2006.01) | |
| H03L 7/099 | (2006.01) | |
| H03L 7/093 | (2006.01) | |

(52) U.S. Cl.
CPC .......... *H03L 7/0802* (2013.01); *H03B 5/32* (2013.01); *H03L 7/0992* (2013.01); *H03L 7/093* (2013.01)

(58) Field of Classification Search
CPC .................................................. H03L 7/0802
USPC ........................................................ 331/18
See application file for complete search history.

(56) References Cited

U.S. PATENT DOCUMENTS

| | | | | |
|---|---|---|---|---|
| 9,825,587 | B1* | 11/2017 | Kirschner | ................ H03B 5/06 |
| 2004/0061559 | A1 | 4/2004 | Charlon | |
| 2005/0083139 | A1* | 4/2005 | Gazit | ....................... H03B 5/06 |
| | | | | 331/158 |
| 2005/0151596 | A1* | 7/2005 | Lin | ......................... H03B 5/06 |
| | | | | 331/158 |

FOREIGN PATENT DOCUMENTS

| | | |
|---|---|---|
| CN | 103580689 A | 2/2014 |
| EP | 3048722 A1 | 7/2016 |
| WO | 2006070234 A1 | 7/2006 |

OTHER PUBLICATIONS

International Search Report dated Apr. 4, 2019 in the corresponding PCT application(aplication No. PCT/CN2018/121606).

* cited by examiner

*Primary Examiner* — Joseph Chang
(74) *Attorney, Agent, or Firm* — Kilpatrick Townsend & Stockton LLP

(57) ABSTRACT

Techniques are described for fast wakeup of a crystal oscillator circuit. Embodiments operate in context of a crystal oscillator coupled with a phase-locked loop (PLL). For example, prior to entering sleep mode, embodiments retain a previously obtained coarse code used to coarse-tune a voltage controlled oscillator of the PLL. On wakeup, the PLL is configured in a chirp mode, in which the retained coarse code and a sweep voltage are used to generate a chirp signal at, or close to, a target stimulating frequency for the crystal oscillator. The chirp signal can be used to inject energy into the crystal oscillator, thereby causing the crystal oscillator to move from sleep mode to steady state oscillation relatively quickly.

20 Claims, 8 Drawing Sheets

FAST WAKEUP FOR CRYSTAL OSCILLATOR

FIELD OF THE INVENTION

The present invention relates generally to clock circuits. More particularly, embodiments of the present invention relate to fast wakeup of crystal oscillator reference clocks coupled with phased-lock loop circuits.

BACKGROUND OF THE INVENTION

Various types of oscillators are commonly used to provide a reference signal for use within electronic applications. Their piezoelectric properties allow them to be a frequency-determining element in electronic circuits. A crystal oscillator, particularly one made of quartz crystal, is distorted by an electric field when voltage is applied to an electrode near or on the crystal. This property is known as electrostriction or inverse piezoelectricity. When the field is removed, the quartz, which oscillates in a precise frequency, generates an electric field as it returns to its previous shape, and this can generate an oscillating voltage that can be used as a precise clock signal.

Typically, a crystal oscillation circuit includes a crystal oscillator, an inverter coupled in parallel with the crystal oscillator, and capacitors coupled to the input and output of the inverter and to ground. To conserve power, the crystal oscillation circuit includes an enable/disable mechanism. At certain times (e.g., when dependent electronics are in a sleep mode, or the like), the crystal oscillator can be disabled. The crystal oscillator can be started by injecting energy composed of noise and/or transient power supply response. The startup time of a crystal oscillator is typically determined by the noise or transient conditions at turn-on, small-signal envelope expansion due to negative resistance, and large-signal amplitude limiting.

It is known that crystal resistance is not constant, typically being higher at start-up than when oscillating in steady state. The crystal resistance can relate to the Q factor of the oscillator, which can dictate the amount of power applied to the crystal to keep it oscillating at a particular amplitude. As the resistance decreases, so does the amount of power consumed for maintaining oscillation at the particular amplitude. The variation in the crystal resistance causes more power to be used at start-up than is desired to achieve the best noise performance in steady state operation. However, decreasing the power such that optimal noise performance is achieved in steady state increases the amount of time for the crystal oscillator to reach steady state from start-up. Thus, there tends to be a design trade-off between power efficiency and start-up time for crystal oscillators.

BRIEF SUMMARY OF THE INVENTION

Embodiments provide circuits, devices, and methods for fast wakeup of a crystal oscillator circuit. Embodiments operate in context of a crystal oscillator coupled with a phase-locked loop (PLL). For example, prior to entering sleep mode, embodiments retain a previously obtained coarse code used to coarse-tune a voltage controlled oscillator of the PLL. On wakeup, the PLL is configured in a chirp mode, in which the retained coarse code and a sweep voltage are used to generate a chirp signal at, or close to, a target stimulating frequency for the crystal oscillator. The chirp signal can be used to inject energy into the crystal oscillator, thereby causing the crystal oscillator to move from sleep mode to steady state oscillation relatively quickly.

According to one set of embodiments, a method is provided for fast wakeup of a clock system having a crystal oscillator coupled with PLL. The method includes: setting the PLL to a chirp mode, thereby configuring a control voltage input of a voltage-controlled oscillator (VCO) of the PLL to be regulated by a sweep voltage; with the PLL in the chirp mode: obtaining a retained coarse code for the VCO, the retained coarse code previously determined as an ultimate coarse code used in a prior wakeup routine of the crystal oscillator, the ultimate coarse code corresponding to a coarse-tuned output frequency of the VCO that approximates a predetermined multiple of a reference frequency output by the crystal oscillator at steady state operation of the crystal oscillator; applying the retained coarse code to tune, according to the coarse-tuned output frequency, a PLL output frequency of a PLL output signal generated by the VCO; outputting by the PLL to the crystal oscillator a chirp signal at a chirp frequency that is divided down from the VCO frequency by the predetermined multiple to approximate the reference frequency; and sweeping the sweep voltage over a predefined voltage range, thereby sweeping the chirp frequency over a frequency range that comprises a target stimulating frequency of the crystal oscillator, such that outputting the chirp signal at the target stimulating frequency stimulates the crystal oscillator to oscillate at the reference frequency; and setting the PLL to an operating mode responsive to detecting the steady state operation of the crystal oscillator, such that, in the normal operating mode, the control voltage of the VCO is regulated by a feedback loop of the PLL as a function of a reference clock signal received at the reference frequency from the crystal oscillator.

According to another set of embodiments, a clock signal generation system is provided with fast oscillator wakeup. The system includes a PLL, that has: a reference input to couple with a reference output of a crystal oscillator to receive a reference clock signal from the crystal oscillator at a reference frequency; a feedback loop to generate a PLL output signal as a predetermined multiple of the reference clock signal, the feedback loop comprising a loop regulation block and a voltage controlled oscillator (VCO) block, the PLL output signal generated by the VCO block at a PLL output frequency as a function of a control voltage input; a chirp output to communicate a chirp signal to a chirp input of the crystal oscillator, such that the chirp signal has a chirp frequency that is divided down from PLL output frequency of the PLL output signal by the predetermined multiple to approximate the reference clock signal; and a mode selector to select between a chirp mode and an operating mode. With the mode selector in the chirp mode, the control voltage input is coupled with a sweep voltage, such that the PLL output frequency is a function of a retained coarse code and the sweep voltage, and sweeping the sweep voltage over a predefined voltage range causes the chirp frequency to sweep over a frequency range that comprises a target stimulating frequency of the crystal oscillator, the retained coarse code previously determined as an ultimate coarse code used in a prior wakeup routine of the PLL, such that the ultimate coarse code corresponding to a coarse-tuned output frequency of the VCO block that approximates the predetermined multiple of the reference clock signal at steady state operation of the crystal oscillator. With the mode selector in the operating mode, the control voltage input is coupled with the loop regulation block, such that the PLL output frequency is a function of the reference frequency.

According to another set of embodiments, a system is provided for fast wakeup of a clock system having a crystal oscillator coupled with a PLL. The system includes a processor and processor-readable memory having, stored thereon, instructions, which, when executed, cause the processor to perform steps. The steps include: receiving a wakeup instruction to wake the clock system from a sleep mode; setting, responsive to the wakeup instruction, the PLL to a chirp mode, thereby: applying a retained coarse code to the VCO to tune a PLL output frequency of a PLL output signal generated by the VCO to a coarse-tuned output frequency that is previously determined as approximating a predetermined multiple of a reference frequency output by the crystal oscillator at steady state operation of the crystal oscillator; configuring a control voltage input of a voltage-controlled oscillator (VCO) of the PLL to be regulated by a sweep voltage; and sweeping the sweep voltage over a predefined voltage range, thereby sweeping a chirp frequency of a chirp signal over a frequency range that comprises a target stimulating frequency of the crystal oscillator, the chirp frequency divided down from the VCO frequency by the predetermined multiple to approximate the reference frequency, such that outputting the chirp signal by the PLL to the crystal oscillator at the target stimulating frequency stimulates the crystal oscillator to oscillate at the reference frequency; and setting the PLL to an operating mode responsive to detecting the steady state operation of the crystal oscillator, thereby configuring the control voltage of the VCO to be regulated by a feedback loop of the PLL as a function of a reference clock signal received at the reference frequency from the crystal oscillator.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

In many electronics applications, it is desirable to generate a stable clock signal at a particular frequency. Depending on the desired frequency or frequencies, accuracy, tolerance to environmental conditions (e.g., noise, changes in temperature, etc.), and/or other factors, various types of oscillators can be used to generate such a clock signal. One common approach is to use a crystal oscillator circuit, having a crystal and other components that are collectively tuned to resonate at a desired reference frequency. A signal output by such a circuit at the reference frequency can be used directly, or can be passed to further signal generation components. For example, the output of the crystal oscillator can be passed to a phase-locked loop circuit, which can perform various functions, such as multiplying the reference frequency to output a higher-frequency clock signal, and/or improving frequency stability under particular conditions.

Figure 1:
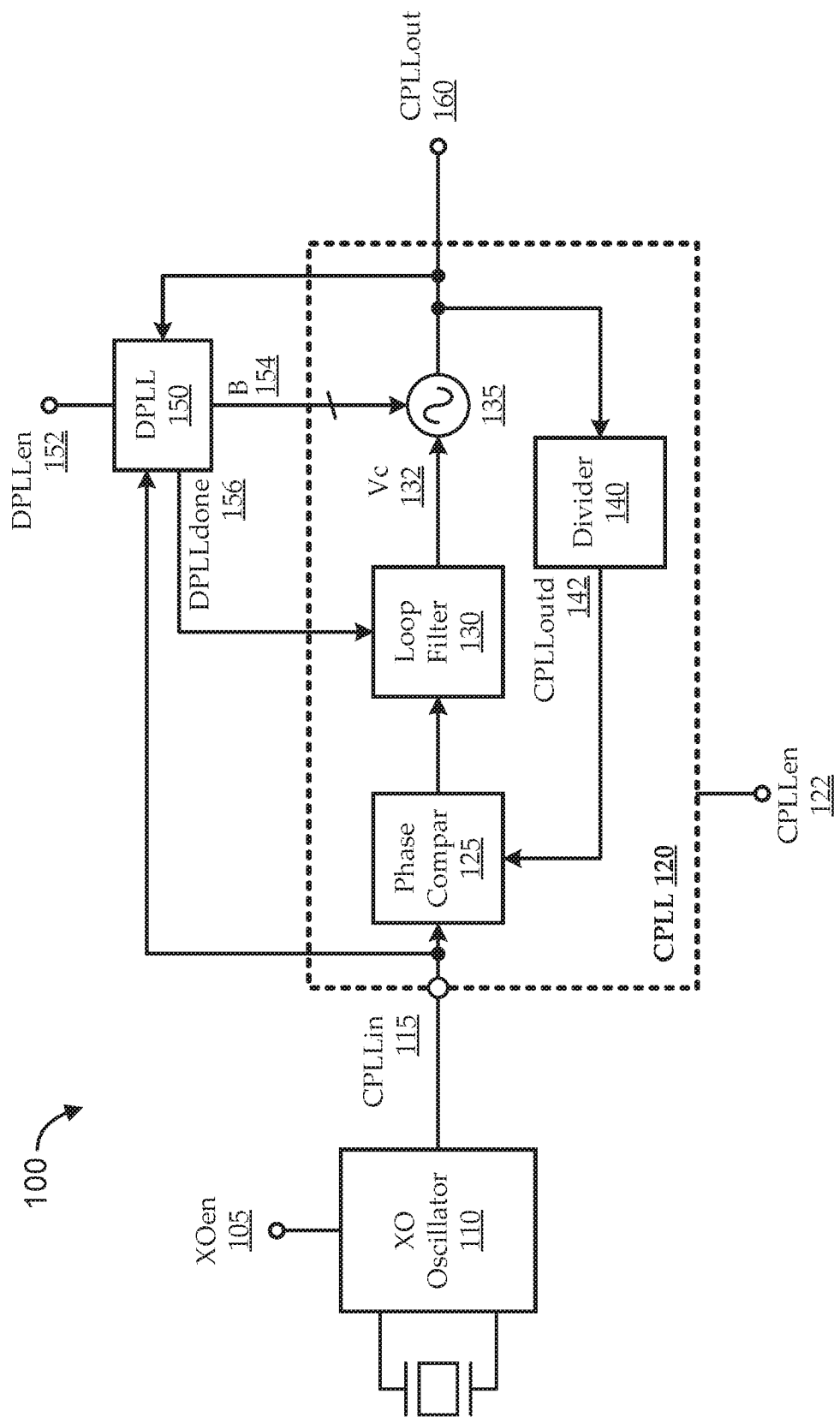
FIG. 1 shows a conventional clock signal generator circuit, having a crystal oscillator circuit coupled with one or more phase-locked-loop (PLL) circuits.

FIG. 1 shows a conventional clock signal generator circuit 100, having a crystal oscillator circuit 110 coupled with one or more phase-locked-loop (PLL) circuits. The crystal oscillator circuit 110 can be implemented in various ways. For example, A crystal oscillator circuit 110 can include a quartz crystal, which is distorted by an electric field when voltage is applied to an electrode near or on the crystal. This property is known as electrostriction or inverse piezoelectricity. When the field is removed, the quartz, which oscillates in a precise frequency, generates an electric field as it returns to its previous shape, which can generate an oscillating voltage that can be used as a precise clock reference signal.

Typically, the crystal oscillator circuit 110 can include a crystal oscillator, an inverter coupled in parallel with the crystal oscillator, and capacitors coupled to the input and output of the inverter and to ground. To conserve power, the crystal oscillation circuit includes an enable/disable mechanism. At certain times (e.g., when dependent electronics are in a sleep mode, or the like), the crystal oscillator circuit 110 can be disabled (sometimes referred to as being put to "sleep," or put into a "sleep mode"). The crystal oscillator can be started (e.g., "woken up," "booted up," or the like) by injecting energy composed of noise and/or transient power supply response. Such a wakeup routine can be started by asserting an enable signal ($XO_{EN}$ 105). The startup time of a crystal oscillator is typically determined by the noise or transient conditions at turn-on, small-signal envelope expansion due to negative resistance, and large-signal amplitude limiting.

Crystal resistance is not constant, typically being higher at start-up than when oscillating in steady state. The crystal resistance can relate to the "Q factor" of the oscillator, which can dictate the amount of power applied to the crystal to keep it oscillating at a particular amplitude. As the resistance decreases, so does the amount of power consumed for maintaining oscillation at the particular amplitude. The variation in the crystal resistance causes more power to be used at start-up than is desired to achieve the best noise performance in steady state operation. However, decreasing the power such that optimal noise performance is achieved in steady state increases the amount of time for the crystal oscillator to reach steady state from start-up. Thus, there tends to be a design trade-off between power efficiency and start-up time for crystal oscillators.

Conventional oscillator circuits use various approaches for addressing this design trade-off. One such approach injects relatively high energy at the start of a wakeup cycle for the crystal oscillator, which can cause faster expansion and can shorten the time for the crystal oscillator to reach its desired frequency. Such an approach can be effective, but it can also use an appreciable amount of power. Further, because of large variances in component and environmental parameters, such an approach can involve injecting the relatively high energy over a large range of frequencies to ensure that the crystal oscillator circuit 110 is stimulated at its resonant frequency. Accordingly, such approaches may be sub-optimal, or may not be practical, in many applications.

In the illustrated conventional circuit 100, the crystal oscillator circuit 110 generates a reference clock signal, which is used as the input reference signal for a PLL. The PLL includes a so-called "coupled PLL" (CPLL) circuit 120 having a frequency reference driven by the crystal oscillator circuit 110, and a digital PLL (DPLL) circuit 150 used to tune the CPLL circuit 120. The CPLL circuit 120 typically includes a phase comparison block 125, a loop filter block 130, and a voltage controlled oscillator (VCO) block 135. The components are generally arranged in a feedback loop to regulate the output signal generated by the CPLL circuit 120 (indicated as $CPLL_{OUT}$ 160) in accordance with an input signal received as a reference by the CPLL circuit 120 (indicated as $CPLL_{IN}$ 115). In some embodiments, the feedback loop includes a divider block 140. For example, the CPLL circuit 120 can be designed to generate $CPLL_{OUT}$ 160 to have an output frequency that is a multiple of the input frequency of $CPLL_{IN}$ 115 (e.g., $CPLL_{IN}$ 115 is at 32 Megahertz, and $CPLL_{OUT}$ 160 is at 192 Megahertz, which is six times faster). In such cases, the divider block 140 can divide the output frequency back down by the same multiple to generate a feedback signal ($CPLL_{OUTD}$ 142), so that the frequency of $CPLL_{OUTD}$ 142 is approximately the frequency of $CPLL_{IN}$ 115 (e.g., the frequencies of $CPLL_{IN}$ 115 and $CPLL_{OUTD}$ 142 should be substantially equal when the CPLL circuit 120 reaches steady state operation).

The phase comparison block 125 can include any suitable components, such as a phase/frequency detector (PFD), or the like, that receives $CPLL_{IN}$ 115 and compares $CPLL_{IN}$ 115 with the fed back signal in the loop ($CPLL_{OUT}$ 160 or $CPLL_{OUT}$ 142). The output of the phase comparison block 125 is a function of the comparison and is fed to the loop filter block 130. The loop filter block 130 can include any suitable components for facilitating filtering over the feedback loop, such as a charge pump and a low-pass filter. The output of the loop filter block 130 can be used as a control voltage for controlling the VCO block 135. The VCO block 135 can include a ring oscillator and/or any other suitable VCO implementation. The output of the VCO block 135 can be $CPLL_{OUT}$ 160.

Many conventional PLLs include an additional digital tuning circuit that can iteratively find a coarse and/or fine code to set parameters of the VCO block 135. In the illustrated implementation, a DPLL block 150 can iteratively settle on a coarse code (B) 154 that coarsely tunes the VCO block 135. In some implementations, the DPLL block 150 can be enabled by asserting a $DPLL_{EN}$ 152 signal, which can cause the DPLL block 150 to search for a value of B 154 that achieves a $CPLL_{OUT}$ 160 that is close to the desired multiple of $CPLL_{IN}$ 115. For example, as illustrated, the DPLL block 150 can include inputs coupled with $CPLL_{OUT}$ 160 and $CPLL_{IN}$ 115, such that the DPLL block 150 can find an optimal value of B 154 without relying on the feedback loop of the CPLL circuit 120. When the DPLL block 150 settles on an optimal value for B 154, a $DPLL_{DONE}$ 156 signal can be communicated to the CPLL circuit 120 (e.g., to the loop filter block 130) to indicate that the digital tuning phase is complete. In this way, the digital tuning phase can tune the VCO block 135 to parameters that yield an output frequency close to what is desired, so that the feedback loop can more easily and reliably lock onto the precise desired output frequency.

Figure 2:
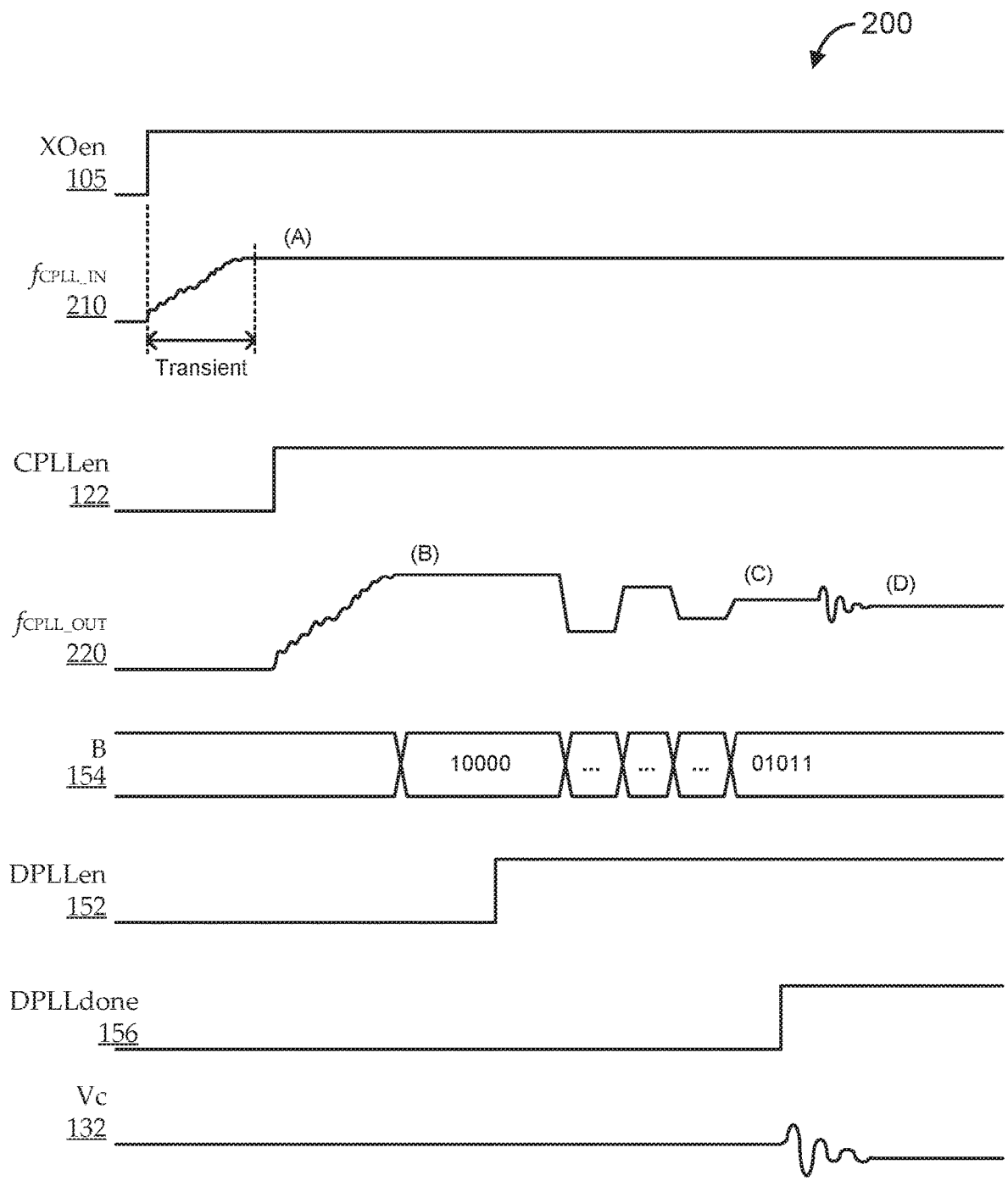
FIG. 2 shows illustrative waveforms reflecting operation of a clock signal generator circuit.

For the sake of added context, FIG. 2 shows illustrative waveforms 200 reflecting operation of a clock signal generator circuit. The illustrative waveforms 200 are intended only to provide general context and clarity to the description. As such, the waveforms 200 are simplified and are not intended to convey accurate scale, timing, etc. Further, as indicated below, some waveforms illustrate voltage, while others illustrate frequency. In context of the conventional clock signal generator circuit 100 of FIG. 1, the illustrated waveforms 200 may reflect either a cold wakeup routine (e.g., initial wakeup of the oscillator circuits, first wakeup after complete power down, etc.) or a warm wakeup routine (e.g., wakeup after the oscillators are in sleep mode). In such contexts, the cold and warm wakeup routines may look substantially identical with respect to the illustrated waveforms 200. In context of the novel types of clock signal generator circuit described herein, the illustrated waveforms may reflect a cold wakeup routine; but a warm wakeup routine operates differently, as described herein.

As illustrated, the wakeup routine can begin by asserting $XO_{EN}$ 105 (e.g., when the voltage level of $XO_{EN}$ 105 transitions from LOW to HIGH. In response, the crystal oscillator circuit 110 can begin to start up. The output of the crystal oscillator circuit 110, and therefore the frequency of $CPLL_{IN}$ 115 ($f_{CPLL\_IN}$ 210), is transient for a time. By some time (A), the crystal has reached its steady state resonance, such that $f_{CPLL\_IN}$ 210 is also at a steady state reference frequency.

Once $f_{CPLL\_IN}$ 210 has reached steady state, the CPLL circuit 120 can be enabled by asserting $CPLL_{EN}$ 122 (e.g., switching the voltage level of $CPLL_{EN}$ 122 from LOW to HIGH). After enabling the CPLL circuit 120, the CPLL circuit 120 can begin to run freely, for example, without usable locking, etc. During that time, the output frequency of the CPLL circuit 120 (i.e., the frequency of $CPLL_{OUT}$ 160, indicated as $f_{CPLLOUT}$ 220) is in a transient state.

At some time (B), the DPLL block 150 can be enabled by asserting $DPLL_{EN}$ 152 (e.g., switching the voltage level of $DPLL_{EN}$ 152 from LOW to HIGH). At that time, B 154 is set to some initial value, setting an initial tuning of the VCO block 135, and causing $f_{CPLLOUT}$ 220 to jump to some initial frequency. As the initial frequency of $f_{CPLLOUT}$ 220 is a function of the initial coarse code setting for the VCO block 135, the initial frequency may be higher or lower than the target $f_{CPLLOUT}$ 220. As illustrated, the DPLL block 150 can begin to iterate, trying different values of B 154 in each iteration, and causing $f_{CPLLOUT}$ 220 to effectively zero in on the target $f_{CPLLOUT}$ 220.

At time (C), an ultimate value for 154 has been found as the value for B 154 that causes $f_{CPLLOUT}$ 220 to most closely approximate the target $f_{CPLLOUT}$ 220. At that time, the DPLL block 150 can communicate a $DPLL_{DONE}$ 156 signal to the CPLL circuit 120 to indicate that the digital tuning phase is complete. Upon completion of the digital tuning phase, it is expected that $f_{CPLLOUT}$ 220 is close enough to the target $f_{CPLLOUT}$ 220, so that the CPLL circuit 120 is capable of regulating $f_{CPLLOUT}$ 220 the rest of the way to the target $f_{CPLLOUT}$ 220. For example, in response to the digital tuning phase being complete, the CPLL circuit 120 is allowed to begin self-regulating in accordance with its feedback loop to achieve and maintain locking of $CPLL_{OUT}$ 160 to the target $f_{CPLLOUT}$ 220. This is indicated as the control voltage to the VCO block 135 ($V_C$ 132) and $f_{CPLLOUT}$ 220 quickly zeroing in on steady state values by time (D), corresponding to $CPLL_{OUT}$ 160 being locked to the target $f_{CPLLOUT}$ 220.

As an example, the steady state $f_{CPLL\_IN}$ 210 reached at time (A) may be 32 Megahertz (MHz), and the target output frequency of the CPLL circuit 120 is 192 MHz (i.e., at the end of the wakeup routine, it is desired for $f_{CPLLOUT}$ 220 to be six times $f_{CPLL\_IN}$ 210). At time (B), the start of the digital tuning phase, $f_{CPLLOUT}$ 220 may initially jump to 240 MHz; and by time (C), the end of the digital tuning phase, $f_{CPLLOUT}$ 220 may have reached a coarse-tuned frequency of 194 MHz (roughly one percent away from the target). Between time (C) and time (D), the CPLL circuit 120 can achieve lock, bringing $V_C$ 132 from 0.5 volts to a steady state level of 0.45 volts, and bringing $f_{CPLLOUT}$ 220 precisely to 192 MHz.

As illustrated by the waveforms 200 of FIG. 2, such a wakeup routine can effectively bring the oscillators of a clock signal generator circuit up to a precise target frequency. However, the waveforms 200 also illustrate that there can be a long relatively long time prior to time (A), during which the output of the crystal oscillator circuit 110 cannot be used as a reliable reference signal. This relatively long transient time can appreciably lengthen the wakeup time of circuits relying on such a reference clock signal, which can be undesirable in some cases.

Figure 3:
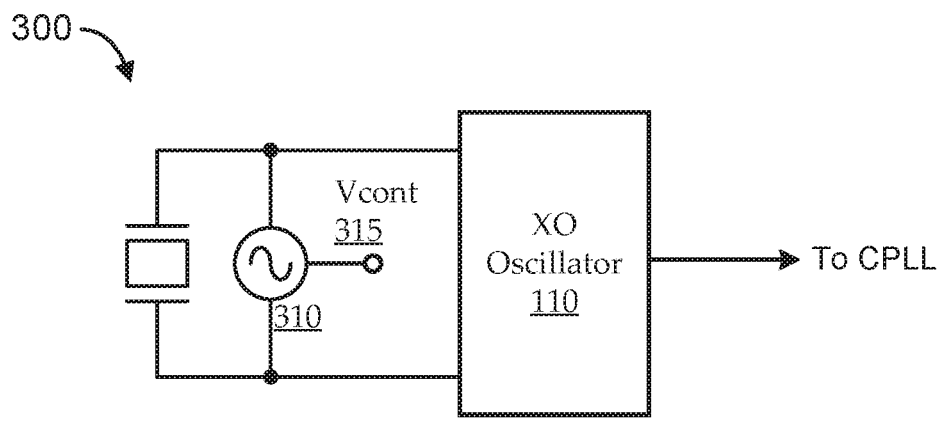
FIG. 3 shows a conventional technique for clock signal generation.

Various techniques have been used to shorten the transient time of the crystal oscillator circuit 110. FIG. 3 shows one such conventional technique. Implementations of such a technique are described in U.S. patent application Ser. No. 15/853,942, titled "Circuit And Method For Facilitating Startup Time Of Crystal Oscillator." As illustrated, a secondary oscillator 310 is inserted in the crystal oscillator circuit 110, and the frequency of the secondary oscillator 310 can be controlled by a control voltage 315. The secondary oscillator 310 can be used to inject a high energy signal to stimulate the crystal in the crystal oscillator circuit 110 to begin resonating. The secondary oscillator 310 can be shut down after the crystal oscillator circuit 110 has reached its steady state oscillation.

Making such stimulation effective typically depends on injecting relatively high energy at a relatively precise frequency. If the injected energy is not at precisely the correct frequency, it may not contribute at all to the startup time of the crystal oscillator circuit 110. However, the precise frequency can vary widely with changes in process, voltage, temperature, etc. Accordingly, such an approach may rely on sweeping the an example, for a crystal oscillator circuit 110 designed to oscillate at 32 MHz, such an approach may involve sweeping the control voltage 315 to cover a secondary oscillator 310 range from 5 MHz to 100 MHz, or the like. Injecting relatively high energy over a large range of frequencies can be undesirable in some applications. For example, such an approach can use appreciable power, which may be undesirable for power-constrained applications.

Figure 4A:
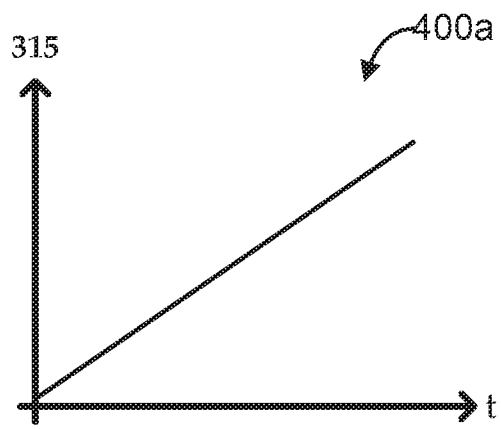
FIGS. 4A and 4B show simplified graphs to illustrate the sweeping involved with an approach, like that of FIG. 3.
Figure 4B:
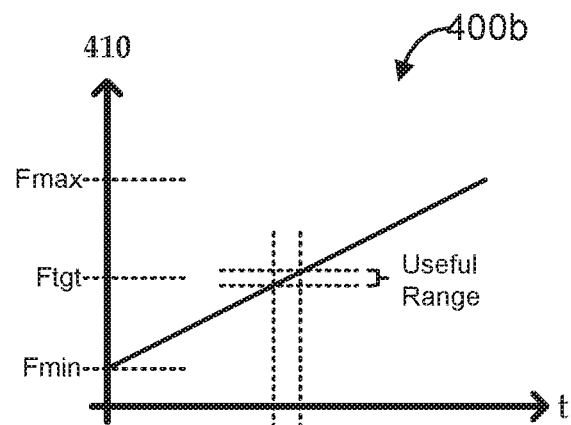

For example, FIGS. 4A and 4B show simplified graphs 400 to illustrate the sweeping involved with an approach, like that of FIG. 3. Graph 400a of FIG. 4A shows the control voltage 315 being swept over a large range. In response thereto, graph 400b of FIG. 4B shows the frequency of energy 410 injected by the secondary oscillator 310 being swept over a correspondingly large range. As illustrated, there is some unknown target frequency (Ftgt) for stimulating the crystal oscillator circuit 110. Because the target frequency is unknown, the frequency of energy 410 may have to be swept over a relatively large range from a minimum frequency (Fmin) to a maximum frequency (Fmax), even though the useful range of frequencies (i.e., over which injected energy will impact startup time of the crystal oscillator circuit 110) is a relatively small range. Accordingly, an insufficient amount of energy may be available in the useful range.

Figure 5:
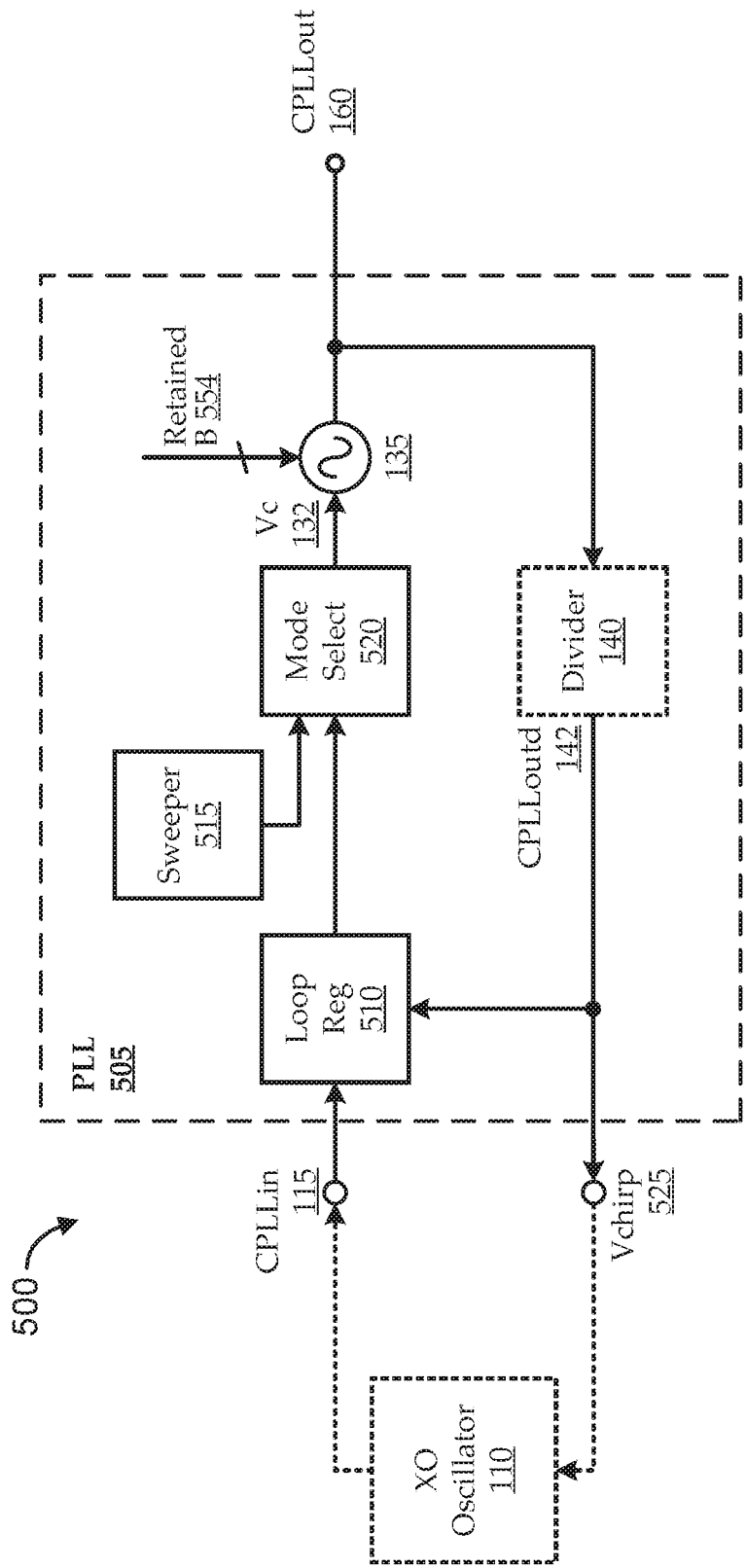
FIG. 5 shows an illustrative clock signal generation system to facilitate fast oscillator wakeup, according to various embodiments.

FIG. 5 shows an illustrative clock signal generation system 500 to facilitate fast oscillator wakeup, according to various embodiments. The clock signal generation system 500 can be implemented as a phase-locked loop (PLL) 505. Some implementations can further include a crystal oscillator 110. As illustrated, the PLL 505 can include a reference input 115 to couple with a reference output of a crystal oscillator 110 to receive a reference clock signal from the crystal oscillator 110 at a reference frequency. The PLL 505 can also include a feedback loop to generate a PLL output signal 160 as a predetermined multiple of the reference clock signal. The feedback loop can include a loop regulation block 510, a mode selector block 520, and a voltage controlled oscillator (VCO) block 135. The PLL output signal 160 is generated by the VCO block 135 at a PLL output frequency as a function of a control voltage input 132.

Embodiments include a chirp output 525 to communicate a chirp signal to a chirp input of the crystal oscillator 110. The chirp signal has a chirp frequency that is a function of the PLL output frequency. For example, some embodiments include a frequency divider block 140 that receives the PLL output signal 160 and outputs a signal having a frequency divided down from the PLL output frequency of the PLL output signal by a predetermined multiple. Typically, the multiple by which the frequency divider block 140 divides down the PLL output frequency is the same as the multiple by which the PLL 505 multiplies up the reference clock signal to generate the PLL output signal 160. For example, at steady state operation, the reference clock signal has a reference frequency of 32 MHz, the PLL output signal 160 has a PLL output frequency of 192 MHz (e.g., assuming a multiple of six), and the output of the frequency divider block 140 has a frequency of 32 MHz (i.e., divided down by the multiple of six). In such cases, the chirp signal can be the output of the frequency divider block 140, such that the chirp frequency approximates the reference frequency.

Embodiments of the mode selector block 520 can select between a chirp mode and an operating mode. For example, the mode selector block 520 can be a multiplexer, or the like, to couple an output with a selected one of multiple inputs. As illustrated, the mode selector block 520 can have an output coupled with the control voltage input 132 of the VCO block 135, a first control input coupled with a sweeper block 515, and a second control input coupled with the loop regulation block 510. In such a configuration, the control voltage input 132 can selectively be controlled, via the mode selector block 520, by either the output of the sweeper block 515 or the output of the loop regulation block 510.

As described herein, when the mode selector block 520 is in the chirp mode, the control voltage input 132 is coupled with the output of the sweeper block 515, which is a sweep voltage. In such a configuration, the PLL output frequency 160 is effectively a function of a retained coarse code 554 and the sweep voltage, and sweeping the sweep voltage over a predefined voltage range causes the chirp frequency to sweep over a frequency range that comprises a target stimulating frequency of the crystal oscillator 110. The retained coarse code 554 is previously determined as an ultimate coarse code used in a prior wakeup routine of the clock signal generation system 500, such that the ultimate coarse code corresponds to a coarse-tuned output frequency of the VCO block 135 that approximates the predetermined multiple of the reference clock signal at steady state operation of the crystal oscillator 110. When the mode selector block 520 is in the operating mode, the control voltage input 132 is coupled with the loop regulation block 510, such that the PLL output frequency is a function of the reference frequency.

Figure 6:
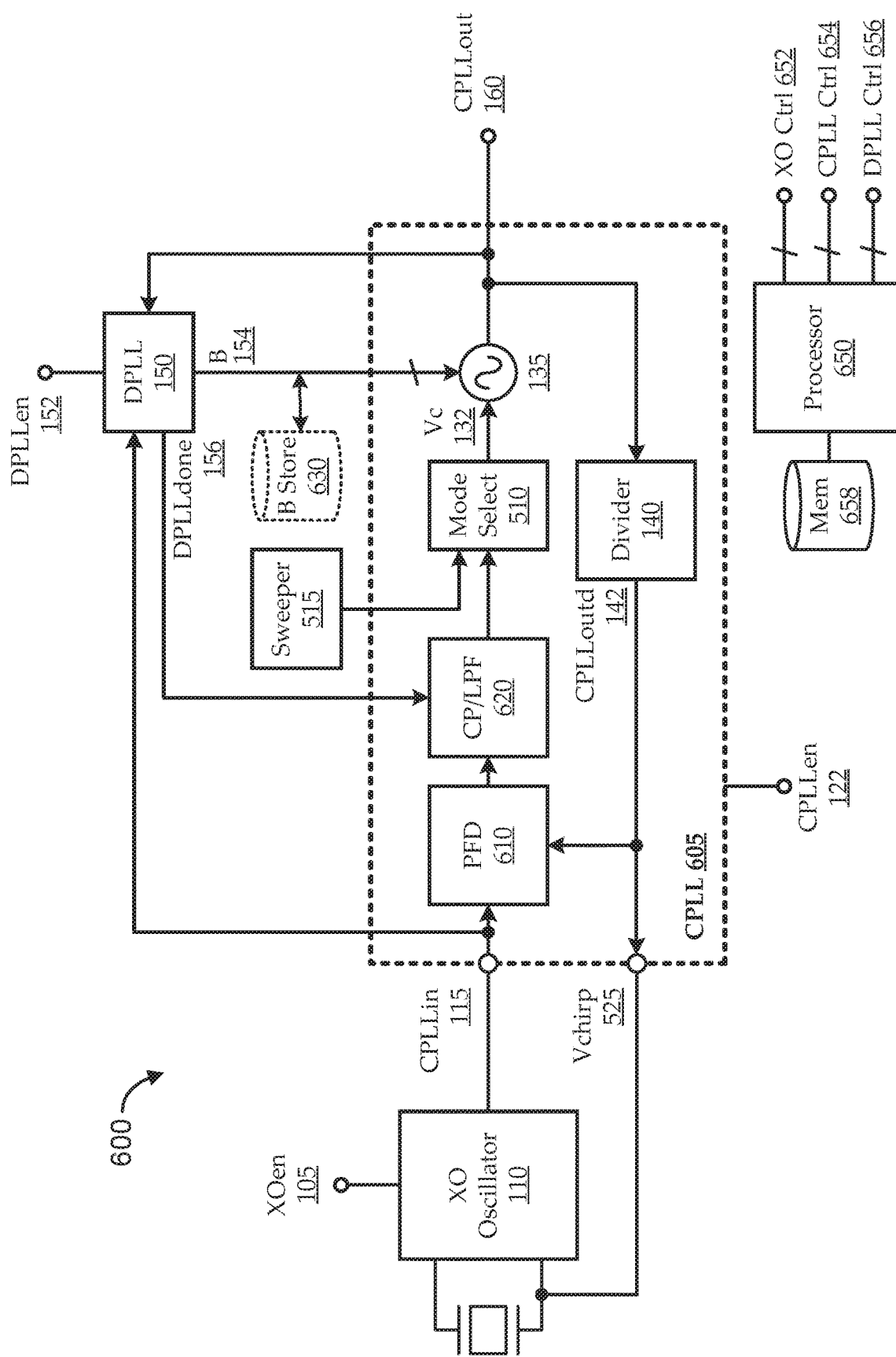
FIG. 6 shows a block diagram of an illustrative implementation of a clock signal generation system, according to various embodiments.

FIG. 6 shows a block diagram of an illustrative implementation of a clock signal generation system 600, according to various embodiments. The clock signal generation system 600 can be an implementation of the clock signal generation system 500 of FIG. 5. The clock signal generation system 600 can include a crystal oscillator 110 coupled with a phase-locked loop (PLL) circuit. In particular, the PLL circuit can have a reference signal input ($CPLL_{IN}$ 115) coupled with a reference signal output of the crystal oscillator 110 by which to receive a reference clock signal at a reference frequency; and the PLL circuit can have a chirp output 525 coupled with a chirp input of the crystal oscillator 110 by which to communicate a chirp signal at a chirp frequency. The communicated chirp signal is generated to inject energy into the crystal oscillator 110 at a target stimulating frequency that stimulates the crystal of the crystal oscillator 110 to begin oscillating at its steady state frequency with an appreciably shorter transient time after being in sleep mode.

The illustrated PLL circuit includes a "coupled PLL" (CPLL) 605 coupled with the crystal oscillator 110 to generate a PLL output signal ($CPLL_{OUT}$ 160) from a reference clock signal generated by the crystal oscillator 110, and a digital PLL (DPLL) 150 coupled with the CPLL 605 to at least partially tune a VCO block 135 of the CPLL 605. For example, as part of a wakeup routine, the DPLL 150 can iteratively generate a coarse tuning code (B) for coarse-tuning the VCO block 135, ultimately settling on a value for B that brings an output frequency of the VCO block 135 to within a few percent of a target PLL output frequency. As illustrated, the CPLL 605 is generally arranged as a feedback loop having a phase/frequency detector (PFD) block 610, a charge pump and low-pass filter (CP/LPF) block 620, a mode selector block 520, a VCO block 135, and a frequency divider block 140. Generally, the feedback loop generates $CPLL_{OUT}$ 160 as a function of the received reference clock signal ($CPLL_{IN}$ 115), and the generated $CPLL_{OUT}$ 160 is regulated by using feedback to control a control voltage input ($V_C$ 132) of the VCO block 135. As described with reference to FIG. 5, embodiments of the CPLL 605 can generate $CPLL_{OUT}$ 160 to have a PLL output frequency that is a multiple of the input frequency of $CPLL_{IN}$ 115; and the frequency divider block 140 can divide the PLL output frequency back down by the same multiple to generate a feedback signal ($CPLL_{OUTD}$ 142) having a frequency that is approximately the frequency of $CPLL_{IN}$ 115 at steady state operation. The $CPLL_{OUTD}$ 142 can be used as the chirp signal and can be communicated to the crystal oscillator 110 via the chirp output 525.

Some embodiments further include a processor 650 (e.g., implemented as a single processor, a portion of a processor, a set of processors, or in any other suitable manner) and memory 658. The memory 658 can be any suitable on-board or off-board processor-readable memory having, stored thereon, instructions, which, when executed, cause the processor to control components of the clock signal generation system 600. The processor 650 is configured to output control signals responsive to control inputs and in accordance with the instructions. For example, the processor 650 can include one or more crystal oscillator output controls (XO Ctrl) 652, one or more CPLL output controls (CPLL ctrl) 654, and one or more DPLL output controls (DPLL Ctrl) 656. These and/or other outputs and inputs of the processor 650 can be coupled with various controls of components, such as crystal oscillator enable 105, CPLL enable 122, DPLL enable 152, DPLL done 156, etc. Embodiments can generate some or all of the control signals in response to receiving a wakeup instruction to wake the clock signal generation system 600 from a sleep mode.

In some embodiments, responsive to receiving the wakeup instruction, embodiments can set the mode selector block 520 to a chirp mode. In the chirp mode, the mode selector block 520 can be configured to couple the control voltage input 132 of the VCO block 135 with a sweep voltage that is output by a sweeper block 515, such that the control voltage input 132 is regulated by the sweep voltage. Embodiments also apply a retained coarse code 554 to the VCO block 135 to tune the PLL output frequency of $CPLL_{OUT}$ 160 to a coarse-tuned output frequency that is previously determined as approximating a predetermined multiple of a reference frequency that is output by the crystal oscillator 110 at steady state operation of the crystal oscillator 110. In such a configuration, the PLL output frequency is approximately the target PLL output frequency (in accordance with the coarse tuning), but can be adjusted over a range by adjusting the sweep voltage at the control voltage input 132. Accordingly, embodiments can sweep the sweep voltage over a predefined voltage range, thereby sweeping the chirp frequency of the chirp signal over a frequency range that includes a target stimulating frequency of the crystal oscillator 110. As described above, the chirp frequency is effectively divided down from the PLL output frequency by the predetermined multiple to approximate the reference frequency, such that outputting the chirp signal to the crystal oscillator 110 at the target stimulating frequency stimulates the crystal oscillator 110 to oscillate at the reference frequency.

When it is determined (e.g., when the processor 650 detects) that the crystal oscillator 110 has reached steady state oscillation, embodiments can set the mode selector block 520 to an operating mode. In the operating mode, the mode selector block 520 can effectively couple the control voltage input 132 of the VCO block 135 into the feedback loop of the CPLL 605, so that the control voltage input 132 is feedback-regulated by the operation of the CPLL 605. For example, the control voltage input 132 can be coupled, via the mode selector block 520, to the output of the CP/LPF block 620.

As described above, the retained coarse code 554 can be generated by the DPLL 150. For example, the DPLL 150 can generate the retained coarse code 554 by iterating through multiple candidate coarse codes to determine one of the candidate coarse codes as corresponding to the coarse-tuned output frequency of the VCO block 135 that most closely approximates the predetermined multiple of the reference clock signal at the steady state operation of the crystal oscillator 110. In some embodiments, the DPLL 150 has an always-on domain that can effectively store the retained coarse code (e.g., by effectively maintaining the value of B at the last determined value prior to the clock signal generation system 600 entering sleep mode). In such implementations, the retained coarse code 554 is obtained by recalling the retained coarse code 554 from the always-on domain of the DPLL 150. In other implementations, the retained coarse code 554 can be stored in any suitable data store 630. Further, in some embodiments, the DPLL 150 can further update the retained coarse code 554 while the mode selector block 520 is in the operating mode by re-iterating through the plurality of candidate coarse codes to determine an updated one of the candidate coarse codes as corresponding to the coarse-tuned output frequency of the VCO block 135 that most closely approximates the predetermined multiple of the reference clock signal at the steady state operation of the crystal oscillator 110. For example, each time the clock signal generation system 600 enters sleep mode, an updated coarse code becomes the retained coarse code 554 that will be used in the next wakeup routine.

Figure 7:
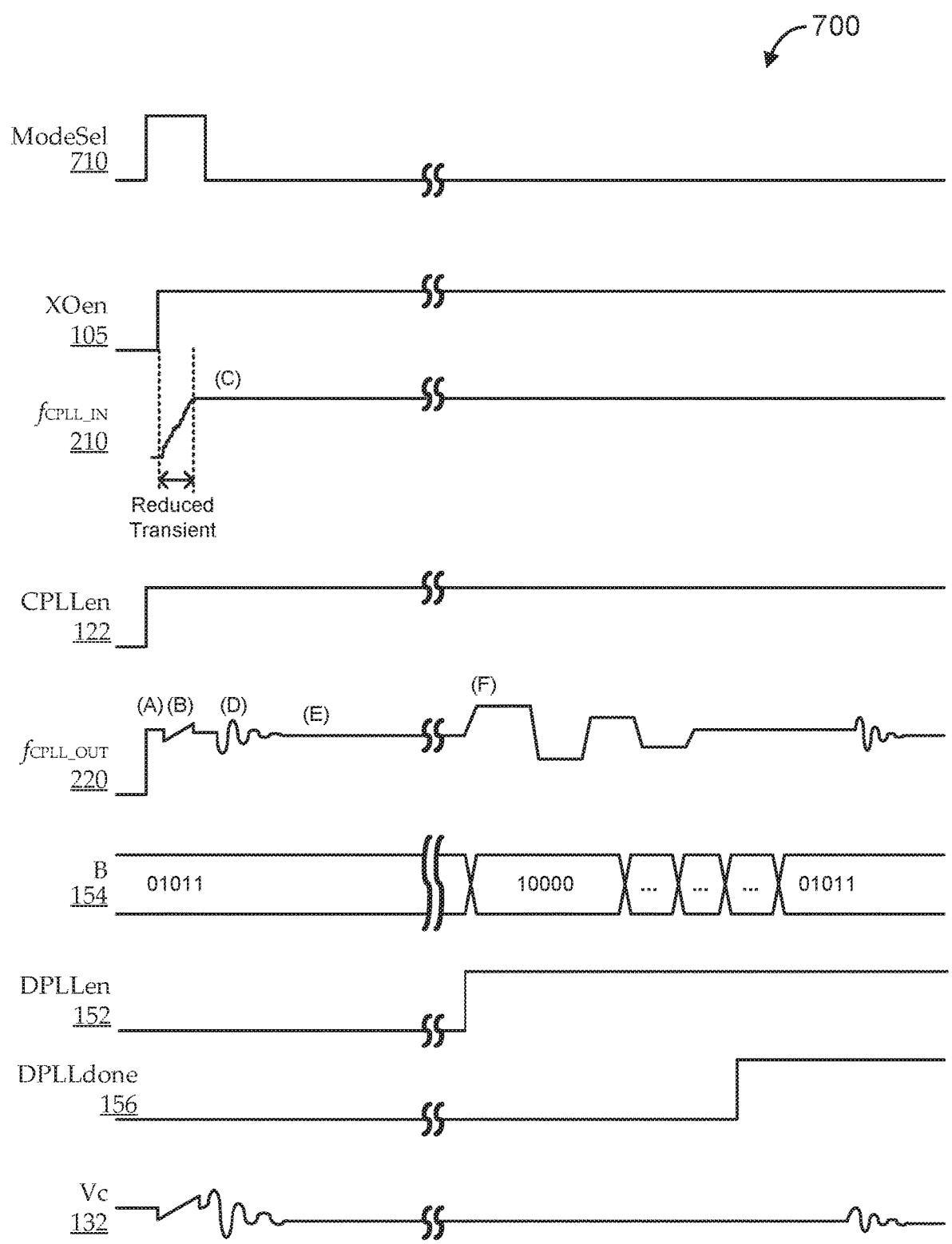
FIG. 7 shows illustrative waveforms reflecting operation of the clock signal generator system of FIG. 5 or 6.

FIG. 7 shows illustrative waveforms 700 reflecting operation of the clock signal generator system of FIG. 5 or 6. To aid in comparison, similar waveforms are shown in a similar manner to the way they are shown in FIG. 2. As such, the illustrative waveforms 700 are intended only to provide general clarity to the description and are not intended to limit particular embodiments or to convey accurate scale, timing, etc. As illustrated, a warm wakeup routine can begin with a mode select signal 710 in a first state corresponding to a chirp mode.

As described with reference to FIG. 6, in the chirp mode, the control voltage input 132 of the VCO block 135 is coarse-tuned by a retained coarse code 554 and further regulated by a sweep voltage. This is reflected in FIG. 7. At the start of the wakeup routine, B 154 is already set to a retained B value ('01011'). As such, when the CPLL is enabled by $CPLL_{EN}$ 122, the PLL output frequency ($f_{CPLLOUT}$ 220) jumps at time (A) to an initial frequency that is already close to a target $f_{CPLLOUT}$ 220 (i.e., a coarse-tuned frequency).

At time (B), the sweep voltage can be swept over a predefined voltage range (indicated by a sweep in $V_C$ 132), causing the $f_{CPLLOUT}$ 220 to sweep (indicated by a sweep in $f_{CPLLOUT}$ 220), thereby causing the chirp frequency to sweep over a frequency range. Because the initial $f_{CPLLOUT}$ 220 is set by the coarse-tuned frequency, it can be known that the initial chirp frequency is close to a target stimulating frequency for the crystal oscillator 110, even without knowing the target stimulating frequency (e.g., where the target stimulating frequency may have shifted due to process, voltage, temperature, and/or other factors). Accordingly, implementations can ensure that the frequency range includes the target stimulating frequency, even using a relatively small sweep voltage range.

Figure 8:
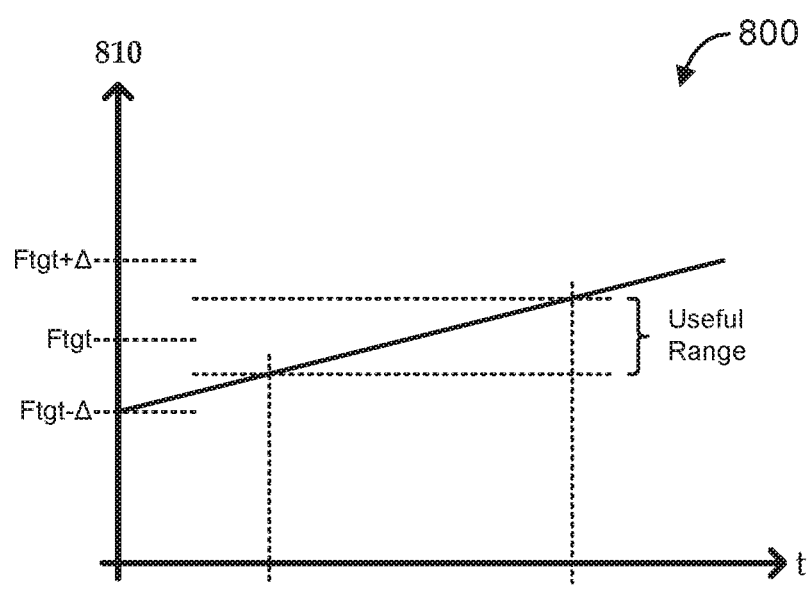
FIG. 8 shows a simplified graph to illustrate the sweeping involved with an approach, like that of FIGS. 5-7.

For example, FIG. 8 shows a simplified graph 800 to illustrate the sweeping involved with an approach, like that of FIGS. 5-7. The graph 800 shows the frequency of energy 810 injected via the chirp output 525 in response to the sweep voltage being swept over the predefined voltage range. As illustrated, though the target stimulating frequency (Ftgt) for stimulating the crystal oscillator circuit 110 is unknown, the frequency range over which the chirp frequency is swept is relatively small. In particular, a large portion of the frequency range (from some Ftgt–Δ to some Ftgt+Δ) results in energy that will likely stimulate oscillation of the crystal oscillator 110. This can be compared to FIG. 4B, in which only a small portion of a large range provides useful energy. In comparison, the novel approach can use appreciably less power by injecting energy at an appreciably smaller range of frequencies, while ensuring that the range includes the target stimulating frequency. As an example, for a target stimulating frequency of approximately 32 MHz, the entire range of chirp frequencies may only include frequencies between approximately 30-35 MHz using the novel approach described herein.

Returning to FIG. 7, using the chirp signal to stimulate the crystal oscillator 110 can cause the crystal oscillator 110 to reach steady state oscillation with an appreciably reduced transient time (e.g., as indicated by the $f_{CPLLIN}$ 210 waveform). As indicated, when $f_{CPLLIN}$ 210 reaches steady state, by time (C), the mode select signal 710 can switch to a second state corresponding to an operating mode (e.g., similar to normal operation of the CPLL). As described above, in the operating mode, the control voltage input 132 of the VCO block 135 is regulated by the feedback loop of the CPLL, which is responsive to the output of the crystal oscillator 110 (i.e., having the frequency of $f_{CPLLIN}$ 210). This can permit the CPLL to self-regulate, moving from the coarse-tuned $f_{CPLLOUT}$ 220 to a $f_{CPLLOUT}$ 220 locked to a target frequency. This is reflected in time (D), during which $V_C$ 132 and $f_{CPLLOUT}$ 220 quickly feedback-regulate to the target $f_{CPLLOUT}$ 220, reaching steady state by time (E).

After the system has reached steady state operation, some embodiments determine an updated coarse code. For example, beginning at time (F), the DPLL can be enabled (indicated as actuating $DPLL_{EN}$ 152), causing the DPLL to iterate through a series of candidate coarse codes (indicated by changing values of B 154 and reflected in changing levels of $f_{CPLLOUT}$ 220). Ultimately, the DPLL can settle on the same, or a different coarse code. Notably, while coarse codes are described herein, some embodiments can additionally or alternatively use fine codes.

Figure 9:
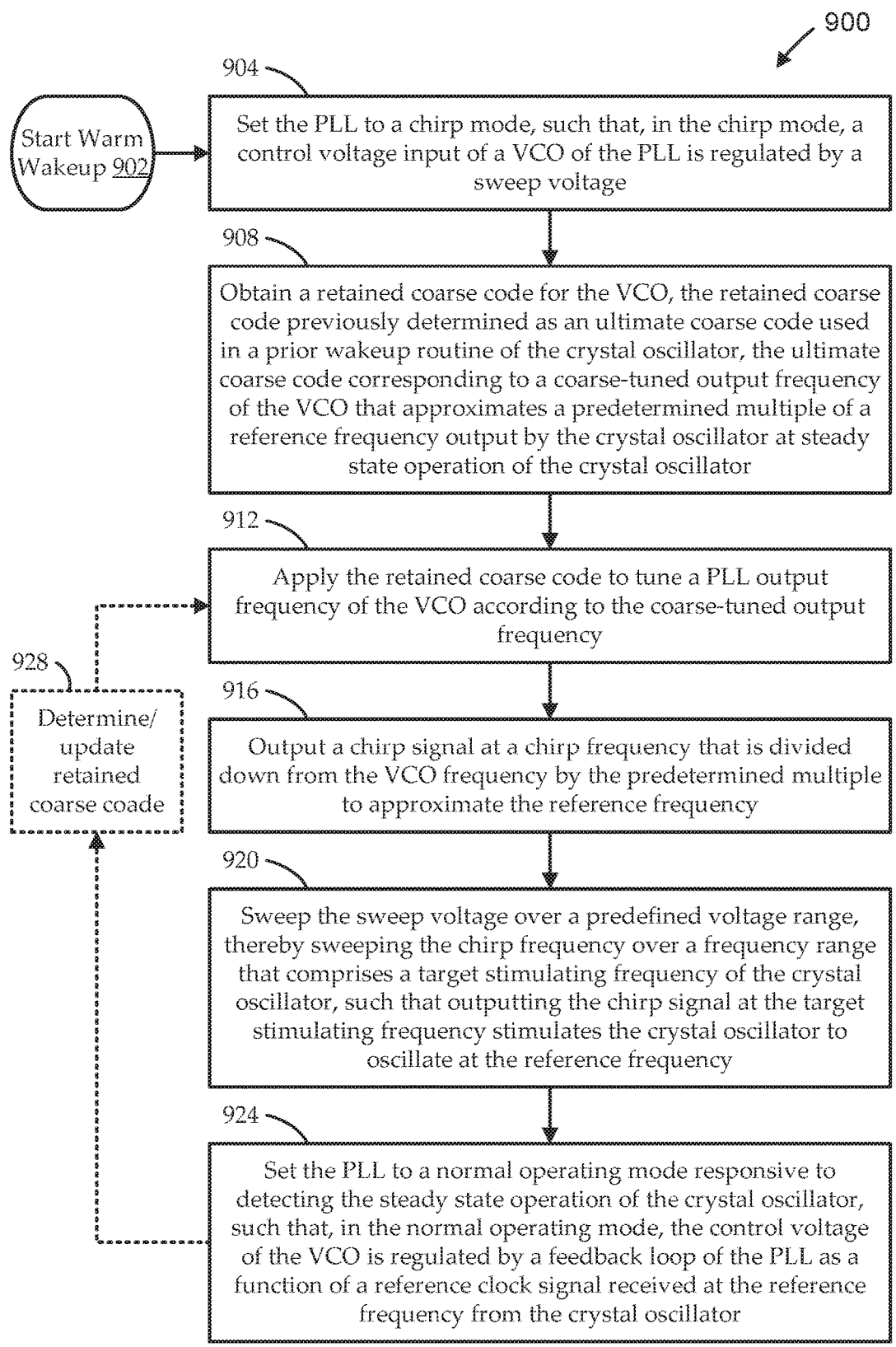
FIG. 9 shows a flow diagram of an illustrative method for fast wakeup of a clock system, according to various embodiments.

FIG. 9 shows a flow diagram of an illustrative method 900 for fast wakeup of a clock system, according to various embodiments. As described herein, the clock system can include a crystal oscillator coupled with a phase-locked loop (PLL). Embodiments begin at stage 904 by setting the PLL to a chirp mode, thereby configuring a control voltage input of a VCO of the PLL to be regulated by a sweep voltage. Some embodiments begin at stage 902 by receiving an instruction to initiate a warm wakeup routine for the clock system while the clock system is in a sleep mode. In such embodiments, setting the PLL to the chirp mode at stage 904 can be performed in response to receiving the instruction.

Embodiments can proceed to perform stages 908-920 with the PLL in the chirp mode. At stage 908, embodiments can obtain a retained coarse code for the VCO. The retained coarse code can be previously determined as an ultimate coarse code used in a prior wakeup routine of the crystal oscillator, whereby the ultimate coarse code corresponds to a coarse-tuned output frequency of the VCO that approximates a predetermined multiple (e.g., six) of a reference frequency output by the crystal oscillator at steady state operation of the crystal oscillator. For example, the coarse-tuned output frequency of the VCO can approximate the predetermined multiple of the reference frequency at the steady state operation of the crystal oscillator to within five percent (or one or two percent, etc.) of the predetermined multiple of the reference frequency. As one example, the coarse-tuned output frequency is approximately 194 MHz, and the predetermined multiple of the reference frequency is 192 MHz (6*32 MHz), such that the coarse-tuned output frequency is within approximately 1-2 percent of the predetermined multiple of the reference frequency. The prior wakeup routine can be a cold or warm wakeup routine. In some implementations, the retained coarse code is stored in an always-on domain of a digital phase-locked loop (DPLL) coupled with the PLL. For example, the PLL includes a CPLL portion coupled with the crystal oscillator, and a DPPL portion to coarse tune the VCO of the CPLL portion. In such implementations, obtaining the retained coarse code at stage 908 can include recalling the retained coarse code from the always-on domain of the DPLL.

At stage 912, embodiments can apply the retained coarse code to tune, according to the coarse-tuned output frequency, a PLL output frequency of a PLL output signal generated by the VCO. At stage 916, embodiments can output (e.g., by the PLL to the crystal oscillator) a chirp signal at a chirp frequency that is divided down from the VCO frequency by the predetermined multiple to approximate the reference frequency. At stage 920, embodiments can sweep the sweep voltage over a predefined voltage range, thereby sweeping the chirp frequency over a frequency range that comprises a target stimulating frequency of the crystal oscillator, such that outputting the chirp signal at the target stimulating frequency stimulates the crystal oscillator to oscillate at the reference frequency.

At stage 924, embodiments can set the PLL to an operating mode responsive to detecting the steady state operation of the crystal oscillator, such that, in the normal operating mode, the control voltage of the VCO is regulated by a feedback loop of the PLL as a function of a reference clock signal received at the reference frequency from the crystal oscillator. In some implementations, while the PLL is in operating mode, the method 900 can update the retained coarse code by enabling an iterative tuning routine of the DPLL. For example, the updated coarse code can then be used as the retained coarse code in a subsequent wakeup routine.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A method for fast wakeup of a clock system having a crystal oscillator coupled with a phase-locked loop (PLL), the method comprising:

setting the PLL to a chirp mode, thereby configuring a control voltage input of a voltage-controlled oscillator (VCO) of the PLL to be regulated by a sweep voltage;

with the PLL in the chirp mode:

obtaining a retained coarse code for the VCO, the retained coarse code previously determined as an ultimate coarse code used in a prior wakeup routine of the crystal oscillator, the ultimate coarse code corresponding to a coarse-tuned output frequency of the VCO that approximates a predetermined multiple of a reference frequency output by the crystal oscillator at steady state operation of the crystal oscillator;

applying the retained coarse code to tune, according to the coarse-tuned output frequency, a PLL output frequency of a PLL output signal generated by the VCO;

outputting by the PLL to the crystal oscillator a chirp signal at a chirp frequency that is divided down from the VCO frequency by the predetermined multiple to approximate the reference frequency; and sweeping the sweep voltage over a predefined voltage range, thereby sweeping the chirp frequency over a frequency range that comprises a target stimulating frequency of the crystal oscillator, such that outputting the chirp signal at the target stimulating frequency stimulates the crystal oscillator to oscillate at the reference frequency; and setting the PLL to an operating mode responsive to detecting the steady state operation of the crystal oscillator, such that, in the normal operating mode, the control voltage of the VCO is regulated by a feedback loop of the PLL as a function of a reference clock signal received at the reference frequency from the crystal oscillator.

2. The method of claim 1, further comprising:
receiving an instruction to initiate a warm wakeup routine for the clock system while the clock system is in a sleep mode,
wherein setting the PLL to the chirp mode is performed in response to receiving the instruction.

3. The method of claim 1, wherein:
the retained coarse code is stored in an always-on domain of a digital phase-locked loop (DPLL) coupled with the PLL; and
the obtaining comprises recalling the retained coarse code from the always-on domain of the DPLL.

4. The method of claim 3, further comprising:
updating, with the PLL in the normal operating mode, the retained coarse code by enabling an iterative tuning routine of a digital phase-locked loop (DPLL) coupled with the PLL.

5. The method of claim 1, wherein the prior wakeup routine is a cold wakeup routine.

6. The method of claim 1, wherein the coarse-tuned output frequency of the VCO approximates the predetermined multiple of the reference frequency at the steady state operation of the crystal oscillator to within five percent of the predetermined multiple of the reference frequency.

7. The method of claim 1, wherein the predetermined multiple is six.

8. A clock signal generation system with fast oscillator wakeup, the system comprising:
a phase-locked loop (PLL) comprising:
a reference input to couple with a reference output of a crystal oscillator to receive a reference clock signal from the crystal oscillator at a reference frequency;
a feedback loop to generate a PLL output signal as a predetermined multiple of the reference clock signal, the feedback loop comprising a loop regulation block and a voltage controlled oscillator (VCO) block, the PLL output signal generated by the VCO block at a PLL output frequency as a function of a control voltage input;
a chirp output to communicate a chirp signal to a chirp input of the crystal oscillator, such that the chirp signal has a chirp frequency that is divided down from PLL output frequency of the PLL output signal by the predetermined multiple to approximate the reference clock signal; and
a mode selector to select between a chirp mode and an operating mode, such that:
with the mode selector in the chirp mode, the control voltage input is coupled with a sweep voltage, such that the PLL output frequency is a function of a retained coarse code and the sweep voltage, and sweeping the sweep voltage over a predefined voltage range causes the chirp frequency to sweep over a frequency range that comprises a target stimulating frequency of the crystal oscillator, the retained coarse code previously determined as an ultimate coarse code used in a prior wakeup routine of the PLL, such that the ultimate coarse code corresponding to a coarse-tuned output frequency of the VCO block that approximates the predetermined multiple of the reference clock signal at steady state operation of the crystal oscillator; and with the mode selector in the operating mode, the control voltage input is coupled with the loop regulation block, such that the PLL output frequency is a function of the reference frequency.

9. The system of claim 8, further comprising:
the crystal oscillator, having the reference output coupled with the reference input of the PLL, and the chirp input coupled with the chirp output of the PLL.

10. The system of claim 8, wherein the PLL further comprises:
a frequency divider block to generate a feedback signal as a function of the PLL output signal, such that the feedback signal has a feedback frequency that is divided down from the frequency of the PLL output signal by the predetermined multiple, the frequency divider block further to communicate the feedback signal to the loop regulation block.

11. The system of claim 10, wherein the chirp signal is the feedback signal.

12. The system of claim 8, wherein:
the mode selector comprises a multiplexer having a first control input coupled with the sweep voltage, a second control input coupled with the loop regulation block, a control output coupled with the control voltage of the VCO block, and a selector input,
such that, the multiplexer couples the first control input with the control output when the selector input is in a first state, and the multiplexer couples the second control input with the control output when the selector input is in a second state.

13. The system of claim 8, wherein the PLL further comprises:
a digital phase-locked loop (DPLL) to generate the retained coarse code by iterating through a plurality of candidate coarse codes to determine one of the candidate coarse codes as corresponding to the coarse-tuned output frequency of the VCO block that most closely approximates the predetermined multiple of the reference clock signal at the steady state operation of the crystal oscillator.

14. The system of claim 13, wherein:
the DPLL has an always-on domain having the retained coarse code stored thereby; and
with the mode selector in the chirp mode, the retained coarse code is obtaining from the always-on domain of the DPLL.

15. The system of claim 13, wherein with the mode selector in the operating mode:
the DPLL is further to update the retained coarse code by re-iterating through the plurality of candidate coarse codes to determine an updated one of the candidate coarse codes as corresponding to the coarse-tuned output frequency of the VCO block that most closely approximates the predetermined multiple of the reference clock signal at the steady state operation of the crystal oscillator.

16. The system of claim 8, wherein the loop regulation block comprises:
a phase frequency detector to generate a comparison signal as a function of comparing the reference clock signal and a feedback signal that is a function of the PLL output signal; and
a loop filter to generate a control output signal as a function of the comparison signal,
wherein, with the mode selector in the operating mode, the control voltage input is driven by the control output signal.

17. The system of claim 8, wherein the prior wakeup routine is a cold wakeup routine.

18. The system of claim 8, wherein the coarse-tuned output frequency of the VCO block approximates the predetermined multiple of the reference frequency at the steady state operation of the crystal oscillator to within five percent of the predetermined multiple of the reference frequency.

19. The system of claim 8, wherein the predetermined multiple is six.

20. A system for fast wakeup of a clock system having a crystal oscillator coupled with a phase-locked loop (PLL), the system comprising:

a processor;

processor-readable memory having, stored thereon, instructions, which, when executed, cause the processor to perform steps comprising:

receiving a wakeup instruction to wake the clock system from a sleep mode;

setting, responsive to the wakeup instruction, the PLL to a chirp mode, thereby:

applying a retained coarse code to a voltage-controlled oscillator (VCO) to tune a PLL output frequency of a PLL output signal generated by the VCO to a coarse-tuned output frequency that is previously determined as approximating a predetermined multiple of a reference frequency output by the crystal oscillator at steady state operation of the crystal oscillator;

configuring a control voltage input of the VCO of the PLL to be regulated by a sweep voltage; and sweeping the sweep voltage over a predefined voltage range, thereby sweeping a chirp frequency of a chirp signal over a frequency range that comprises a target stimulating frequency of the crystal oscillator, the chirp frequency divided down from the VCO frequency by the predetermined multiple to approximate the reference frequency, such that outputting the chirp signal by the PLL to the crystal oscillator at the target stimulating frequency stimulates the crystal oscillator to oscillate at the reference frequency; and setting the PLL to an operating mode responsive to detecting the steady state operation of the crystal oscillator, thereby configuring the control voltage of the VCO to be regulated by a feedback loop of the PLL as a function of a reference clock signal received at the reference frequency from the crystal oscillator.

\* \* \* \* \*